United States Patent [19]

Jablonski et al.

[11] Patent Number: 4,613,810

[45] Date of Patent: Sep. 23, 1986

[54] HIGH OUTPUT PROGRAMMABLE SIGNAL CURRENT SOURCE FOR LOW OUTPUT IMPEDANCE APPLICATIONS

[75] Inventors: Daniel G. Jablonski, Silver Spring, Md.; Richard W. Watkins, Goleta, Calif.

[73] Assignee: The United States of America as represented by the Secretary of the Navy, Washington, D.C.

[21] Appl. No.: 732,330

[22] Filed: May 10, 1985

[51] Int. Cl.$^4$ .............................................. G05F 1/44
[52] U.S. Cl. .................................. 323/271; 307/313; 330/265
[58] Field of Search ............... 323/269, 271, 272, 273; 330/263, 265; 307/491, 313, 288, 315

[56] References Cited

U.S. PATENT DOCUMENTS

| | | | |
|---|---|---|---|
| 3,174,095 | 3/1965 | Cocker | 307/31 |
| 3,646,428 | 2/1972 | Torok | 323/22 T |
| 3,696,286 | 10/1972 | Ule | 323/15 |
| 3,697,862 | 10/1972 | Taylor | 323/9 |
| 3,703,678 | 11/1972 | Weller | 323/19 |
| 3,803,503 | 4/1974 | Greutman | 330/265 |
| 3,953,778 | 4/1976 | Taddeo et al. | 323/25 |
| 4,044,297 | 8/1977 | Nobue et al. | 323/4 |
| 4,207,475 | 6/1980 | Nercessian | 307/52 |
| 4,221,979 | 9/1980 | Ahmed | 307/255 |
| 4,302,726 | 11/1981 | Shobbrook | 323/271 X |
| 4,384,261 | 5/1983 | Yokoyama | 330/265 X |
| 4,395,675 | 7/1983 | Toumani | 323/271 |
| 4,433,303 | 2/1984 | Sasaki | 330/265 X |
| 4,435,679 | 3/1984 | Bedard et al. | 323/350 |

FOREIGN PATENT DOCUMENTS 2115999 9/1983 United Kingdom ............... 330/265

Primary Examiner—Peter S. Wong
Assistant Examiner—Marc S. Hoff
Attorney, Agent, or Firm—Kenneth E. Walden; Frederick A. Wein

[57] ABSTRACT

The present invention relates to a high output programmable current source. Complementary output stages are connected between appropriate power supply polarities for driving a low impedance load which is connected to circuit ground. An operational amplifier is connected between the input and emitter of each of the complementary stages providing negative feedback for virtually eliminating the input offset voltage of the respective output stage. A programmable function signal source is connected to the operational amplifiers for driving a programmable signal current to the extent possible through the load resistance from a limited voltage supply.

1 Claim, 6 Drawing Figures

HIGH OUTPUT PROGRAMMABLE SIGNAL CURRENT SOURCE FOR LOW OUTPUT IMPEDANCE APPLICATIONS

BACKGROUND OF THE INVENTION

The present invention relates to programmable current sources, and more particularly, to programmable current sources having a high output into a low load impedance from a low voltage power supply.

In applications such as oceanography, the problem encountered is that the waters of the ocean, having significant amounts of sodium chloride and other ion producing compounds, present a very low impedance of the order of ½ ohm resistance. Accordingly, it is difficult to drive high currents into such a low resistance in such oceanographic applications, especially when such apparatus is portable and powered by batteries having limited voltage capacity, such as 6 volts. Prior art devices are very limited in this respect.

Accordingly, it is desirable to provide apparatus for driving high amperage peak to peak current in to a low impedance load from a low voltage power supply with minimum losses and voltage drop.

OBJECTS OF THE INVENTION

Accordingly, it is an object of the present invention to provide a current source able to drive a high value of signal current through a low resistance load with minimum losses.

Another object of the present invention is to be able to drive a high value of programmable current into a low resistance load powered from a limited voltage battery.

Further objects and advantages of the present invention will become apparent as the following description proceeds and features of novelty characterizing the invention will be pointed out with particularity in the claims annexed to and forming a part of this specification.

SUMMARY OF THE INVENTION

Briefly, the present invention relates to a high output programmable current source. Complementary output stages are connected between appropriate power supply polarities for driving a low impedance load which is connected to circuit ground. An operational amplifier is connected between the input and emitter of each of the complementary stages providing negative feedback for virtually eliminating the input offset voltage of the respective output stage. A programmable function signal source is connected to the operational amplifiers for driving a programmable signal current to the extent possible through the load resistance from a limited voltage supply.

DESCRIPTION OF THE DRAWINGS

For a better understanding of the present invention reference may be had to the accompanying drawings wherein.

DETAILED DESCRIPTION OF THE PREFERRED EMBODIMENT

In oceanographic environments it is often desirable to generate large electrical currents in a remote environment with said electrical currents being programmable for various waveforms in the range from DC to greater than 1 KHz. Additionally, the device needs to be small and drive the electrical current through a low impedance conducting media such as sea water.

Figure 1A:
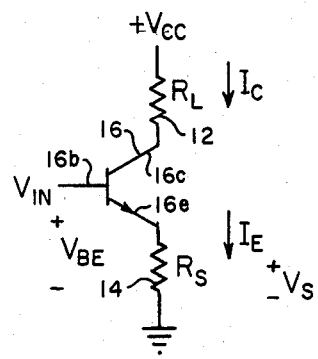
FIGS. 1a-d are a plurality of schematic drawings explaining various aspects of the present invention.

Referring now to the drawings wherein like reference numerals have been applied to like members there is shown in FIG. 1a a schematic of a current source of conventional design having a collector resistance 12 and an emitter resistance 14. For such a circuit, the current through transistor 16 is independent of the resistor 12. Thus, resistor 12 can be removed and the current through the circuit and resistor 14 will be the same with the exception that the transistor collector voltage will now be higher and the dissipation within transistor 16 will thus increase. For such a circuit, the value of collector current assuming sufficient drive into the base of transistor 16, will be generally dependent upon the value of supply voltage and the value of the resistor 14.

Figure 1B:
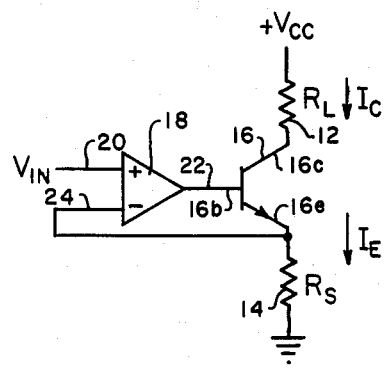
Figure 1C:
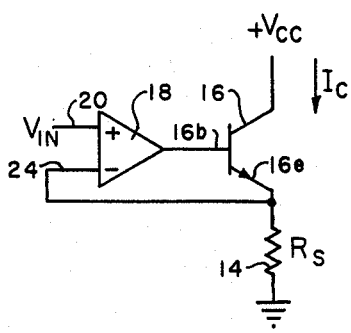
Figure 1D:
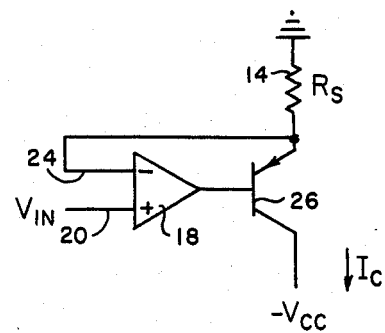

For the present current source, it is desired to be usable in a portable instrument having limited power supply voltage capacity, thus voltage drop between base to emitter as transistor 16 is not insignificant and consitutes an undesirable offset voltage. Accordingly, referring now to FIG. 1b there is included an operational amplifier 18 having an input terminal 20, an output terminal 22 and a negative feedback terminal 24. As shown in FIG. 1b, the output of amplifier 18 is connected to the base of transistor 16 and the output at the emitter 16e is connected to terminal 24 of operational amplifier 18 to provide a negative feedback. For such a configuration, the offset voltage between the base and emitter of transistor 16 is effectively divided by the gain of the amplifier 18 and the amplification of amplifier 18 is very large, thus virtually eliminating the offset voltage. FIG. 1c shows a circuit combining the features of FIGS. 1a and 1b as discussed above. The complementary circuit of FIG. 1c is shown in FIG. 1d wherein transistor 16 (NPN) is shown as transistor 26 (PNP).

Figure 2:
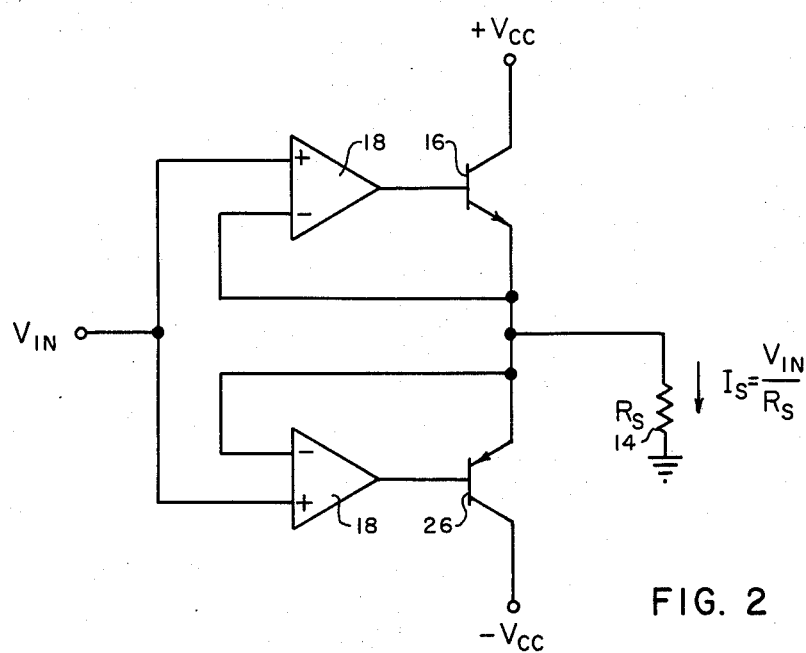
FIG. 2 is a schematic drawing showing a portion of the present invention.

FIG. 2 shows a combination of the features shown in FIG. 1 wherein complementary transistors 16 and 26 are connected in series to load resistor 14 which is connected to ground, a pair of operational amplifiers 18 are connected between a respective input of transistors 16 and 26, and connected to a complementary power source (not shown) having plus and minus polarity terminals with a center tap connected to ground for the load current return. It should be noted that by eliminating the original load resistors 12 and creating what would ordinarily be a reference resistor Rs as the new load 14, it is possible to combine the circuit of FIGS. 1c and 1d such a shown in FIG. 2. The circuit of FIG. 1c will operate only for positive input voltages and the circuit in FIG. 1d will operate only for negative input. However the combined circuits will operate both positive and negative inputs as shown in FIG. 2 with minimal cross-over distortion. Additionally, operational amplifiers 18 substantially reduce errors in the output current due to finite turn on voltages.

Figure 3:
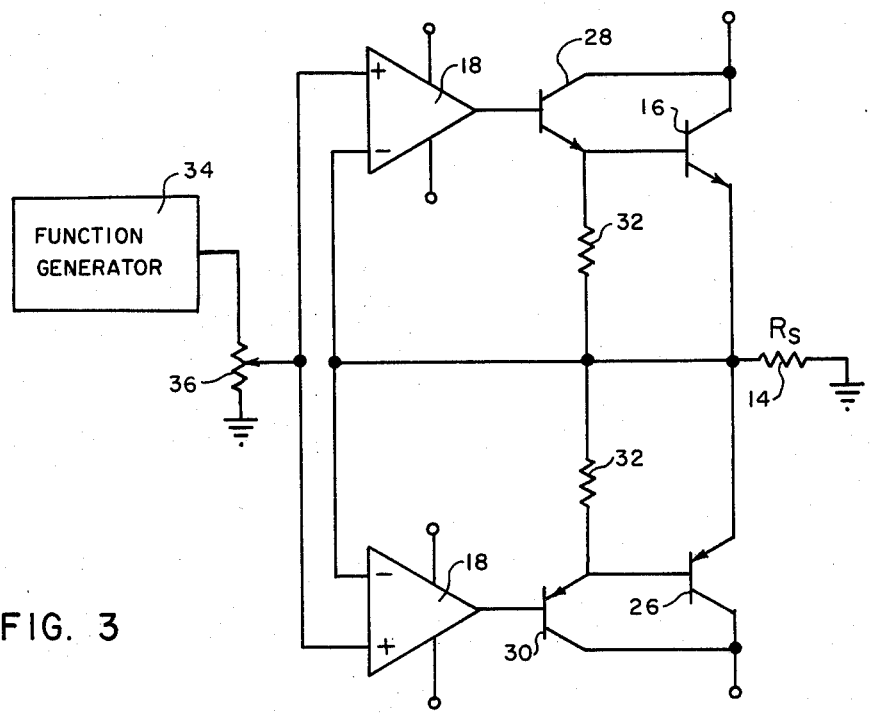
FIG. 3 is an overall schematic drawing of the present invention including aspects of FIG. 2.

Referring now to FIG. 3, in order to extend the output range of the devices 16 and 26, additional transistors are provided for a Darlington pair. NPN transistor 28 feeds transistor 16 and PNP transistor 30 feeds transistor 26. Transistors 28, 30 each have appropriate emitter resistors 32. In order to generate a sinusoidal signal or any other desired programmed function signal to drive the current source, a generator 34 is provided and feeds the current source through potentiometer 36. In the exemplary embodiment oscillator 34 is an Intersil 8038 function generator chip. It should be noted that function generator 34 can be an appropriate oscillator, a synthesizer, or the like.

It should be noted that resistor 14 is the resistance of whatever load the generator is driving. In the exemplary embodiment for an oceanographic application, the resistance of sea water is expected to be of the order of ½ ohm. In operation from a ±6 volt supply, the exemplary circuit can drive up to 8 amperes peak to peak into the ½ ohm load. This maximum current level will decrease if the load resistance is increased, or if the supply voltage $\pm V_{cc}$ is decreased. The disclosed device has the advantage of having a minimal current drain out of the water. Thus, there is no need for an on-off switch and the device is self-actuated upon immersion while having a long shelf-life.

The power supply of small size is preferred for remote self contained operation. The power supply can be nickel cadium batteries, lithium batteries or, in the exemplary embodiment, high current flat pack batteries manufactured by Polaroid Corporation. Two sets of batteries are required in order to provide the complementary supply voltage. Additional batteries can be added in series or parallel depending upon load resistance and current levels desired.

Thus there is presented a programmable current source wherein the complementary output stage drives a low impedance at high current levels from a limited power supply and wherein the voltage drop of said current source is minimized.

While there has been illustrated and described what is at present considered to be a preferred embodiment of the present invention, it will be appreciated that numerous changes and modifications are likely to occur to those skilled in the art and it is intended in the appended claims to cover all of those changes and modifications which fall within the true spirit and scope of the present invention.

What is claimed as new and desired to be secured by Letters Patent of the United States is:

1. A programmable current source comprising:

a complementary output stage comprising a pair of complementary output devices each having a signal input terminal, a current input terminal, and a current output terminal, the current output terminal of each of the two complentary devices being directly connected to each other and an external load having a current return path to ground, the current input terminals of each of the devices being directly connected to an appropriate polarity of an external complementary power source having a current return to said ground, each of the pair of complenmentary output device drawing a respective drain current from the respective polarity of the complementary power source through the load to ground, and the input signal terminal being adapted for receiving appropriate polarities of signal for the respective output devices to drive a corresponding current through the load, the input terminals having a respective input offset characteristic with respect to the respective current output terminal, amplifier means each having a signal input terminal, an output terminal, and a negative feedback input terminal, the output terminals being connected to respective input terminals of the output devices, the feedback terminal being connected to the load, for virtually eliminating the input offset of the respective output device, and signal generation means for generating a function signal and feeding said signal to the output devices through the amplifier means for driving a corresponding polarity of current through the load, the external load being a resistance provided by electrical conduction of a liquid with which the current source is used and the power supply drain current source being switchable from a first power supply drain current to a second power supply drain current by immersion or removal of the output and ground terminals from the liquid.

* * * * *